United States Patent
Ghosh et al.

(10) Patent No.: US 11,905,819 B2
(45) Date of Patent: Feb. 20, 2024

(54) COMPOSITE POLYCRYSTALLINE DIAMOND (PCD) PRODUCT AND METHODS OF MAKING SAME

(71) Applicant: Element Six (UK) Limited, Oxfordshire (GB)

(72) Inventors: Santonu Ghosh, Oxfordshire (GB); Christopher John Howard Wort, Oxfordshire (GB)

(73) Assignee: Element Six (UK) Limited (GB)

( * ) Notice: Subject to any disclaimer, the term of this patent is extended or adjusted under 35 U.S.C. 154(b) by 37 days.

(21) Appl. No.: 17/613,833

(22) PCT Filed: May 27, 2020

(86) PCT No.: PCT/EP2020/064635
§ 371 (c)(1),
(2) Date: Nov. 23, 2021

(87) PCT Pub. No.: WO2020/239800
PCT Pub. Date: Dec. 3, 2020

(65) Prior Publication Data
US 2022/0243578 A1   Aug. 4, 2022

(30) Foreign Application Priority Data

May 28, 2019 (GB) ..................... 1907508

(51) Int. Cl.
*E21B 10/567* (2006.01)
*E21B 47/013* (2012.01)
(Continued)

(52) U.S. Cl.
CPC ............ *E21B 47/013* (2020.05); *C23C 14/14* (2013.01); *C23C 14/34* (2013.01); *C23C 16/27* (2013.01); *E21B 10/567* (2013.01)

(58) Field of Classification Search
CPC ....... E21B 10/567; E21B 10/56; E21B 47/013
See application file for complete search history.

(56) References Cited

U.S. PATENT DOCUMENTS 9,695,642 B2 * 7/2017 Hay .................... E21B 47/0228
9,695,683 B2 * 7/2017 Kumar .................... E21B 10/08
(Continued)

FOREIGN PATENT DOCUMENTS

CA   2489187 A1   6/2005
CN   102712970 A   10/2012
(Continued)

OTHER PUBLICATIONS

International Search Report and Written Opinion issued for PCT/EP2020/064635, dated Aug. 3, 2020 (11 pages).
(Continued)

*Primary Examiner* — Kenneth L Thompson
(74) *Attorney, Agent, or Firm* — Armstrong Teasdale LLP

(57) ABSTRACT

A composite product has a body of polycrystalline diamond (PCD) material having a PCD proximal end and a PCD distal end, an electronic device including an electronic component, and a connection portion joining the electronic device to the body at the PCD distal end, and comprising metallic join material having a liquidus temperature of 600° C. to 950° C. at atmospheric pressure. At least one of the electronic device and the body includes an electrically insulating portion between the electronic component and the PCD proximal boundary establishing an electrical open circuit condition between the electronic component and the PCD proximal boundary. A method of making the composite product is also disclosed.

20 Claims, 8 Drawing Sheets

(51) Int. Cl.
*C23C 14/14* (2006.01)
*C23C 14/34* (2006.01)
*C23C 16/27* (2006.01)

(56) References Cited

U.S. PATENT DOCUMENTS

| | | | |
|---|---|---|---|
| 10,584,581 B2* | 3/2020 | Cao | E21B 10/602 |
| 10,689,977 B2* | 6/2020 | Scott | E21B 49/003 |
| 11,111,732 B2* | 9/2021 | Zhan | E21B 47/01 |
| 11,668,185 B2* | 6/2023 | Zhan | E21B 47/13 175/40 |
| 2003/0017018 A1 | 1/2003 | Fukano | |
| 2009/0152018 A1 | 6/2009 | Sani | |
| 2011/0266055 A1 | 11/2011 | DiGiovanni et al. | |
| 2012/0061149 A1 | 3/2012 | Liversage et al. | |
| 2012/0138370 A1 | 6/2012 | Mukhopadhyay et al. | |
| 2013/0270007 A1 | 10/2013 | Scott et al. | |
| 2013/0270008 A1* | 10/2013 | DiGiovanni | E21B 47/00 175/40 |
| 2014/0198827 A1 | 7/2014 | Liversage | |
| 2014/0224539 A1 | 8/2014 | Kumar et al. | |
| 2016/0010395 A1 | 1/2016 | Trinh et al. | |
| 2022/0234113 A1* | 7/2022 | Ghosh | E21B 47/013 |
| 2022/0243537 A1* | 8/2022 | Kanyanta | E21B 10/567 |
| 2022/0381093 A1* | 12/2022 | Ghosh | E21B 10/52 |
| 2023/0003120 A1* | 1/2023 | Ghosh | E21B 47/013 |
| 2023/0015853 A1* | 1/2023 | Wort | E21B 10/56 |

FOREIGN PATENT DOCUMENTS

| | | |
|---|---|---|
| CN | 103124800 A | 5/2013 |
| EP | 3205428 A1 | 8/2017 |
| WO | 2011090582 A1 | 7/2011 |
| WO | 2011139697 A2 | 11/2011 |
| WO | 2011144670 A1 | 11/2011 |
| WO | 2014028685 A1 | 2/2014 |
| WO | 2017127533 A1 | 7/2017 |

OTHER PUBLICATIONS

Combined Search and Examination Report issued for GB1907508.4, dated Nov. 13, 2019 (5 pages).
Combined Search and Examination Report issued for GB2007871.3, dated Oct. 28, 2020 (5 pages).
Zou, Zengda "Handbook of Welding Materials, Processes and Equipment," Chemical Industry Press, pp. 733-734, Aug. 31, 2001—English Translation Appended at the beginning.
Chinese Office Action and Search Report issued for CN Application No. 2020800494096, dated Nov. 6, 2023 (19 pages).

* cited by examiner

COMPOSITE POLYCRYSTALLINE DIAMOND (PCD) PRODUCT AND METHODS OF MAKING SAME

CROSS REFERENCE TO RELATED APPLICATIONS

This application is a U.S. national stage entry under 35 U.S.C. § 371 of PCT/EP2020/064635 filed on May 27, 2020 which claims priority to GB 1907508.4 filed on May 28, 2019, both of which are incorporated by reference in their entirety for all purposes.

FIELD

This disclosure relates generally to composite products comprising electronic devices joined to a body of polycrystalline diamond (PCD) material, and to methods for making same. The composite products may be cutter elements for machine tools, particularly but not exclusively for earth-boring drill bits, such as for use in oil and gas exploration; and/or the electronic device may be at least a part of a sensor system.

BACKGROUND

Polycrystalline diamond (PCD) material is used in a wide variety of tools for cutting, machining, drilling or degrading hard or abrasive materials such as rock, metal, ceramics, composites and wood-containing materials. PCD cutter elements used in industrial tools or in rock-boring bits, for example, may be exposed in use to high temperatures, as well as highly abrasive or erosive conditions. This makes it challenging to locate sensors on the PCD cutter element to measure local cutting conditions or to evaluate the working condition of the cutter element.

For example, drill bits used for boring into the earth to drill for oil or gas include arrays of PCD cutter elements, which are driven against rock deep beneath the earth's surface. The depth of operation of the PCD cutter elements adds to the difficulty of assessing their working condition. Owing to the high cost of pulling a drill bit to the surface to inspect the cutter elements, there is a need to be able to do this in situ, while the bit is drilling into rock down the hole (DTH).

U.S. Pat. No. 7,487,849 discloses leaching cobalt from a layer of PCD material and joining the leached PCD to a cemented carbide substrate by means of braze material. This can be achieved by placing a layer of the braze material between the leached PCD and the substrate, heating the braze material to melt it, and allowing it to cool.

There is a need for a wide range of composite products comprising articles, particularly electronic devices, and particularly but not exclusively sensor devices, joined to bodies of PCD material, and for methods of joining the electronic devices to the PCD material. Particularly but not exclusively, there is a need for sensor devices joined to PCD cutting tools such as cutting tools for earth-boring drill bits. Electronic components of the electronic device should be electrically isolated, particularly from certain electrically conducting portion of the body to which they are joined, to avoid short-circuiting the electronic device and to ensure its proper operation.

SUMMARY

Viewed from a first aspect, there is provided a composite product comprising: a polycrystalline diamond (PCD) body of PCD material having a PCD proximal end and a PCD distal end; an electronic device including an electronic component, and a connection portion joining the electronic device to the PCD body at the PCD distal end, and comprising metallic join material having a liquidus temperature of 600° C. to 950° C. at atmospheric pressure; at least one of the electronic device and the PCD body including an electrically insulating portion between the electronic component and the PCD proximal boundary establishing an electrical open circuit condition between the electronic component and the PCD proximal boundary.

Viewed from a second aspect, there is provided a method of making the composite product defined above, the method including: providing the PCD body including an electrically insulating PCD portion; providing the electronic device including an electronic component and having a device surface; providing metallic join material having a liquidus temperature of 600° C. to 950° C. at atmospheric pressure, and capable of chemically bonding to the PCD material and the device surface; arranging the metallic join material between the device surface and the distal PCD end, the metallic join material being electrically insulated from the PCD proximal end by the electrically insulating PCD portion; heating the metallic join material to a temperature of at least the liquidus temperature and no greater than 950° C., to allow the metallic join material to melt and connect the body and the device surface; and allowing the metallic join material to cool and solidify, to form the connection portion, the electrically insulating portion electrically insulating the connection portion from the PCD proximal end.

Viewed from a third aspect, there is provided a method of making the composite product defined above; the method including: providing the PCD body; providing the electronic device including an electronic component, a device surface and an electrically insulating portion, the electrically insulating portion disposed between the electronic component and the device surface; insulating the electronic component from the device surface; providing metallic join material having a liquidus temperature of 600° C. to 950° C. at atmospheric pressure and capable of chemically bonding to the PCD material and the device surface; arranging the metallic join material between the electronic device surface and the PCD distal end, the metallic join material being electrically insulated from the electronic component by the electrically insulating portion; heating the metallic join material to a temperature of at least the liquidus temperature and no greater than 950° C. to allow the metallic join material to melt and connect the body and the device surface; and allowing the metallic join material to cool and solidify to form the connection portion, the electrically insulating portion electrically insulating the electronic component from the connection portion.

Various example methods and systems are envisaged by this disclosure, of which various non-limiting, non-exhaustive examples and variations are described as follows.

In some example arrangements, the electrically insulating PCD portion may comprise no more than 2 weight percent of electrically conducting material or be substantially free of electrically conducting material.

In some example arrangements, the connection portion may comprise a portion of the PCD material that includes metallic join material within interstitial regions among the diamond grains.

In some example arrangements, the electronic device may comprise a sensor device, for determining a condition of the composite product; and the PCD body may comprise a cutter element having a cutting edge, for an earth-boring drill bit.

In example methods where the PCD body is provided with an electrically insulating PCD portion, the electrically insulating PCD portion may be coterminous with the distal PCD end and include no more than 2 weight percent of electrically conducting material or the electrically insulating PCD portion may be substantially free of electrically conducting material. In some examples, the PCD material may comprise a first PCD portion, coterminous with the distal PCD end, and a second PCD portion, in which the first portion extends from the distal PCD end to an interface boundary with the second PCD portion; the first PCD portion comprising a network of interstitial voids among the diamond grains and being electrically insulating. The example method may include allowing molten metallic join material to infiltrate into the first PCD portion by moving through the interstitial voids, to form the connection portion. The interface boundary may be sufficiently remote from the distal PCD end that the connection portion is spaced apart from the second PCD portion by an electrically insulating region of the first PCD portion. In other words, molten metallic join material may not infiltrate all the way through the first PCD portion. The method may include determining a thickness of the first PCD portion that will be sufficiently great for a predetermined quantity of the metallic join material to infiltrate all the way through the first PCD thickness.

In some example methods, the metallic join material may include one or both of silver (Ag) and copper (Cu), and at least one chemical element that reacts with carbon to form a carbide compound, to chemically bond the metallic join material to the diamond grains. For example, the metallic join material may include titanium (Ti).

In some example methods, the metallic join material may comprise a plurality of precursor materials that, when combined and heat treated will form the metallic join material, and the method may include combining the plurality of precursor materials.

In some example methods, metallic join material, or precursor material for the metallic join material, may be deposited onto at least one of the PCD surface or the device surface by a process including physical vapour deposition (PVD) or chemical vapour deposition (CVD); or by depositing paste including grains of the precursor material or grains of the metallic join material.

Some example methods may include removing PCD material from the distal PCD end of the PCD body, to form a recess into the PCD material; in which the recess is configured to accommodate at least a portion or component of the electronic device; depositing a layer of metallic join material (or precursor material) into the recess; and placing the electronic device into the recess, the device surface in contact with the layer of metallic join material.

Some example methods may include reducing the environmental gas pressure of the pre-composite assembly to at most 1 mPa ($10^{-5}$ mbar) when heat treating the metallic join material.

Any apparatus feature as described herein may also be provided as a method feature, and vice versa.

BRIEF DESCRIPTION OF DRAWINGS

Non-limiting example methods and systems will be described with reference to the appended drawings, of which.

DETAILED DESCRIPTION

As used herein, "super-hard" material refers to single- or polycrystalline material having a 1 kg Vickers hardness (HV) of at least 20 GPa. Super-hard material may include single-crystal diamond and cubic boron nitride (cBN) material, as well as certain polycrystalline materials comprising a plurality of diamond or cBN grains. Some super-hard materials may have a 1 kg Vickers hardness of at least 25 GPa, or at least 30 GPa. As used herein, Vickers hardness is according to the ASTM384-08a standard.

As used herein, polycrystalline diamond (PCD) material comprises a plurality of diamond grains, a substantial portion of which are directly inter-bonded with each other or contact each other at grain boundaries. Polycrystalline diamond may comprise diamond grains, or include non-diamond material, or include voids. In some polycrystalline diamond material, the diamond grains may account for at least 80% of the volume of PCD material, substantially all the remaining volume being a network of interstitial regions among the diamond grains. The interstitial regions may be partly or entirely filled with diamond sintering aid material, or other filler material, or at least some of the interstitial regions may contain voids. Sintering aid for diamond may also be referred to as "catalyst material" for promoting the growth of diamond grains or the formation of diamond necks between adjacent diamond grains, under thermodynamically stable conditions for diamond. Catalyst material for diamond may also function as an effective solvent material for carbon, and diamond sintering aid material may also be referred to as "solvent/catalyst" material. Examples of solvent/catalyst materials for diamond include iron (Fe), nickel (Ni), cobalt (Co) and manganese (Mn), and certain alloys including at least one of these elements. PCD material may be produced by subjecting an aggregation of diamond grains to an ultra-high pressure (for example, at least about 6 GPa) and a high temperature (for example, at least about 1,200° C.) in the presence of molten solvent/catalyst material. During the HPHT process, solvent/catalyst material may infiltrate through the interstitial regions among the diamond grains from an adjacent source, such as a Co-cemented tungsten carbide substrate. Consequently, PCD material may comprise or consist essentially of the inter-bonded diamond grains and interstitial regions containing Co. Some polycrystalline diamond material consisting essentially of diamond may be manufactured by a chemical vapour deposition (CVD) process.

Figure 1A:
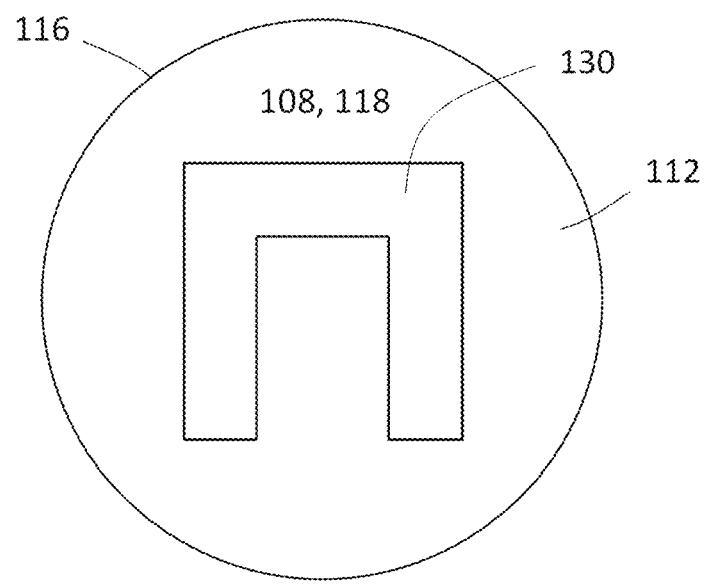
FIG. 1A shows a schematic top view of an example composite product comprising a 'U'-shaped electrical resistor joined to a PCD body.
Figure 1B:
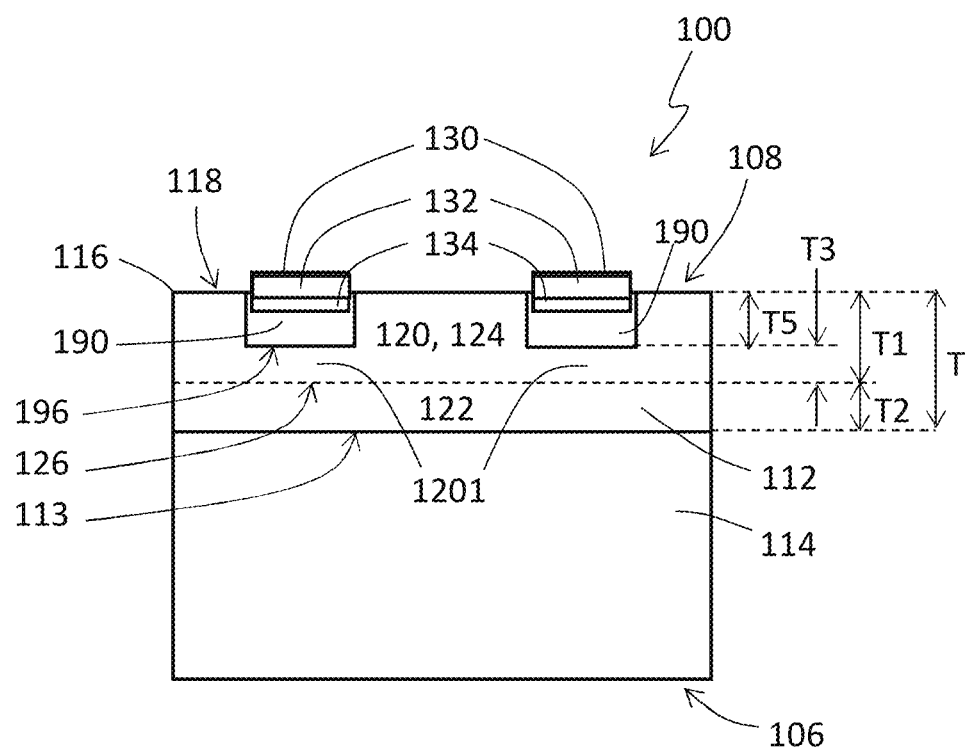
FIG. 1B shows a schematic longitudinal cross-section view through the example composite product shown in FIG. 1A.
Figure 1C:
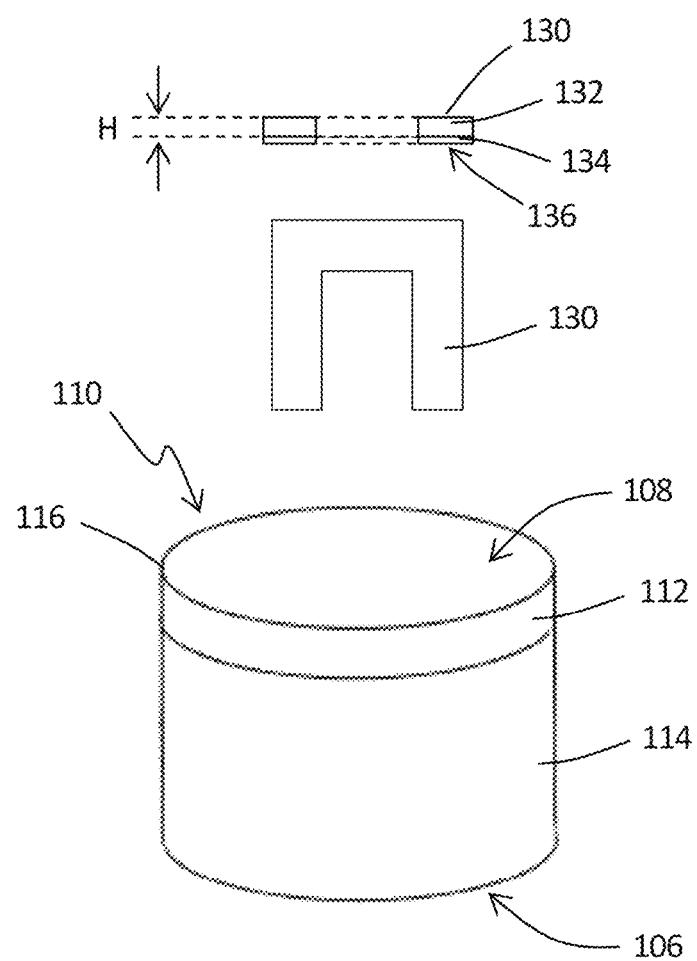
FIG. 1C shows a schematic view of the 'U'-shaped electronic resistor component prior to attachment to the PCD body, and a perspective view of an example cutter insert for an oil and gas drill bit, to which the example resistor may be attached.

With reference to FIGS. 1A to 1C, an example composite product 100 comprises an electronic device 130 attached to an example cutter insert 110 by a connection portion 190, the cutter insert 110 being for an earth boring drill bit (not shown). As used herein, a cutter insert may be a type of cutter element that can be attached to a tool body such as a drill bit by inserting the cutter insert into a recess provided in the tool body; for example, a cutter insert may be braze-joined to a tool body, the cutter insert inserted within a recess in the tool body.

In the particular example shown in FIGS. 1A to 1C, the electronic device 130 is 'U'-shaped and comprises a resistor 132 attached to a base plate of electrically insulating material 134, the base plate 134 having a device surface 136. The cutter insert 110 is a substantially right cylindrical body having a proximal end 106 and a distal end 108, and comprising a PCD portion 112 comprising or consisting essentially of PCD material 112, joined at an interface boundary 113 to a cobalt-cemented tungsten carbide (Co—WC) substrate portion 114. The PCD portion 112 may have the general form of a PCD layer 112 joined to the substrate portion 114. The interface boundary 113 may be planar or non-planar and define a proximal PCD end 113 of the PCD material 112. A distal PCD end 108 of the PCD portion 112 may define the distal end 108 of the cutter insert 110. The PCD portion 112 has a PCD surface 118 at the distal end 108 and a mean thickness T from the proximal PCD end 113 to the distal PCD end 108 of about 2 to 3 mm. The PCD surface 118 includes a peripheral cutting edge 116 for cutting into rock (not shown), for example. The substrate portion 114 is coterminous with the proximal end 106 of the cutter insert 110. In some examples, the cutter insert 110 may not include a substrate portion 114 and may consist essentially of PCD material 112.

In this example arrangement, the PCD portion 112 includes a first PCD portion 120 and a second PCD portion 122. The first PCD portion 120 is coterminous with the PCD surface 118 at the distal PCD end 108 and extends a mean depth T1 of about 300 to about 500 microns from the distal PCD end 108 to an interface boundary 126 with the second PCD portion 122. The second PCD portion 122 extends a depth T2 of about 1.5 to about 2.8 mm from the interface boundary 126 with the first PCD portion 120 to the interface boundary 113 between the PCD material 112 and the substrate portion 114. In the first PCD portion 120, the interstitial regions among the PCD grains (129 and 127, respectively, schematically illustrated in FIG. 2B) form an open porous network of voids, the first PCD portion 120 being electrically insulating and including less than 2 wt. % metallic material. In the second PCD portion 122, the interstitial regions may be substantially filled with metal catalyst material such as Co (or alloy including Co), which may form an interconnected metallic network capable of conducting an electric current. In other example arrangements, the PCD portion 112 may have a substantially uniform microstructure throughout its volume.

In this example, the connection portion 190 joining the device surface 136 to the layer of PCD material 112 may comprise metal alloy, a substantial portion of which is infiltrated into the interstitial pores of the first PCD portion 120. A non-infiltrated portion 124 of the first PCD portion 120 has an interface boundary 196 with the connection portion 190. The maximum depth T5 of the connection portion 190 from the PCD surface 118 into the first PCD portion 120 may be about 200 microns, and the first PCD portion 120 may include a non-infiltrated, electrically insulating intermediate region 1201 between the interface boundary 196 with the connection portion 190 and the interface boundary 113 with the substrate portion 114. The intermediate region 1201 electrically isolates the connection portion 190 from the proximal PCD end 113. Therefore, in this particular example, an electrical open circuit condition is established between the electronic component 132 and the proximal PCD end 113 by both the electrically insulating base plate 134 of the electronic device 130 and the electrically insulating region 1201 within the first PCD portion 120.

In some example arrangements, the electronic component 132 may be electrically isolated from the connection portion 190 by the electrically insulating base plate 134 of the electronic device 130, and the connection portion 190 may extend to the second PCD portion 122; in other words, the first PCD portion 120 may not include the intermediate region 1201 between the connection portion 190 and the second PCD portion 122; or, in some examples, the PCD portion 110 may not include an electrically insulating first PCD portion 120. In some example arrangements, the electronic device 130 may not include an electrically insulating base plate 134, and the intermediate region 1201 may be present between the connection portion 190 and the second PCD portion 122, to electrically separate them. In any of these arrangements, the electronic component 132 will be electrically isolated from the second PCD portion 122 and the proximal PCD end 113.

In this example, the resistor component 132 may comprise or consists essentially of Co-cemented WC material 132, or other material such as tungsten W, and has a substantially uniform thickness H of about 800 microns. In various examples, the electronic device 130 may comprise a wide range of various electronic components, including one or more resistor, capacitor, inductor, transistor, electrically conducting tracks, which may be connected in an electric circuit, for example. In some examples, the electronic device 130 may include a sensor or detector, for measuring temperature, strain or other measurable condition of the PCD portion 112, such as a wear condition of the PCD material 112.

In the illustrated example, the 'U'-shaped electronic device 130 may be used as a sensor 130, in which the electrical resistance of the resistor component 132 changes dependent on the temperature of the PCD material 112. For example, the temperature of the PCD material 112 may significantly increase when the cutter insert 110 is brazed onto the drill bit, or when the cutter insert 110 is being used to cut rock and bore into the earth to form a borehole. Changes in the resistance of the resistor component 132 may be calibrated against its temperature, allowing an operator to monitor the temperature of the PCD material 110. In addition, or alternatively, an increase in the electrical resistance of the resistor 130 may indicate that the PCD material 112 has fractured, or that a part of the resistor component 132 has been worn away. For example, if the electrical resistance of the resistor component 132 goes open circuit, this may indicate that the PCD material 112 has fractured all the way through the resistor component 132. If the resistance increases slowly, this may indicate that the PCD material 112 is being gradually worn away, a wear scar (not shown) penetrating into the resistor 132.

An example method for making an example composite product 100, such as that described with reference to FIGS. 1A to 1C, will be described with reference to FIGS. 2A to 2E.

A PCD cutter insert 110 may be provided, comprising (or consisting essentially of) PCD material 112 joined to a substrate portion 114 at an interface boundary 113. For example, a precursor body 102 comprising a PCD portion 112 joined to a substrate portion 114 may be manufactured by means of an ultra-high pressure, high temperature (HPHT) process. An HPHT process may include placing an aggregation of diamond grains onto a Co—WC substrate 114, providing a pre-sinter assembly (not shown), and subjecting the pre-sinter assembly to a pressure of at least about 5.5 GPa, or at least 6 GPa, and a temperature of at least about 1,200° C., or at least about 1,250° C., in the presence of solvent/catalyst material for diamond. In some example processes, the aggregation of diamond grains may include catalyst material such as Co, in powder form or as deposited microstructures on the diamond grains. The Co within the substrate and potentially within the aggregation of diamond grains will melt and infiltrate into interstitial regions among the diamond grains under capillary action and promote the direct inter-growth of neighbouring diamond grains. When the pressure and temperature are decreased to ambient conditions, the Co (or alloy including Co, for example) will solidify, providing a precursor body 102 comprising the layer of PCD material 112 joined to the substrate portion 114, from which the cutter insert 110 (in FIG. 2A) can be processed. As used herein, ambient or atmospheric pressure is about 1.0 MPa and ambient temperature is about 20° C. to about 40° C. The precursor body 102 may have a proximal end 106, coterminous with the substrate portion 114, and a distal portion 108, coterminous with a PCD surface 118 of the PCD material 112. The precursor body 102 may be processed by grinding the PCD portion 112 to form a cutting edge 116 and, in some examples, one or more chamfer (not shown) adjacent the cutting edge 116. The layer of PCD material 112 may have a thickness T of about 2 to 3 mm from the PCD surface 118 to the interface boundary 113, the interstitial regions among the diamond grains filled with metallic material including Co.

Figure 2A:
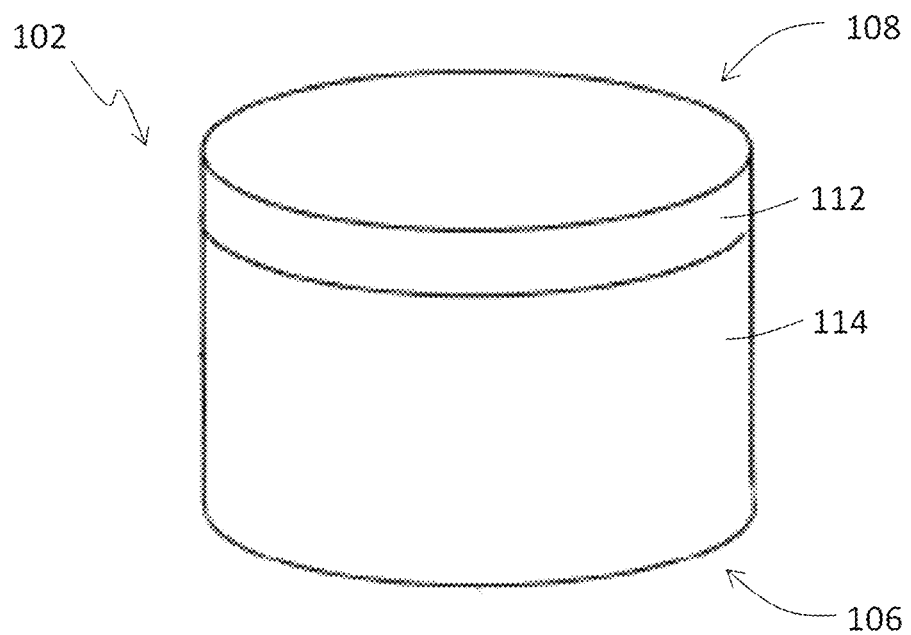
FIG. 2A shows a schematic perspective view of a sintered precursor body, which can be processed to form an example cutter insert.
Figure 2B:
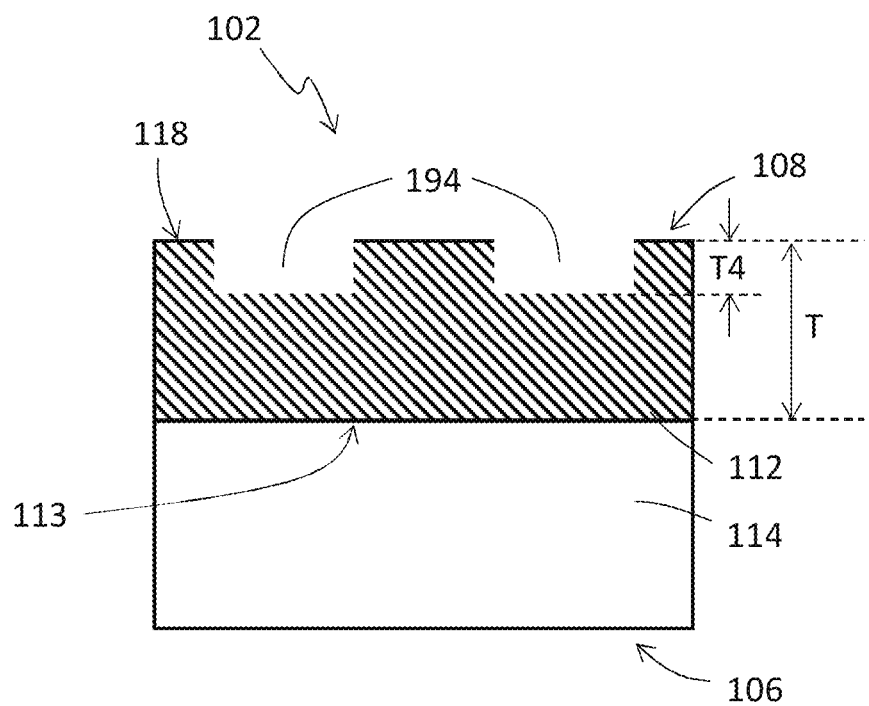
FIG. 2B illustrates a first step in an example process of making a composite product, showing a schematic cross-section view of a longitudinal plane diametrically through a cylindrical example PCD cutter insert, in which the PCD cutter insert comprises a PCD layer joined to a cemented carbide substrate and in which the PCD layer includes a trench for accommodating an example 'U'-shaped resistor (similar to that illustrated in FIGS. 1A to 1C)

With reference to FIG. 2B, the precursor body 102 may be machined or etched to form a trench 194 having a mean depth T4 of about 300 microns into the distal end 108 of the PCD material 112. For example, a laser cutting machine (not shown) may be used to cut or etch the trench 194. The trench 194 may have the shape of the electronic component 130 (in this example, a 'U'-shape when viewed from a top view) to accommodate a part of the electrical component 130. Two portions of the trench 194 are evident in this view, corresponding to the respective arms of the 'U'-shaped electronic device 130.

Figure 2C:
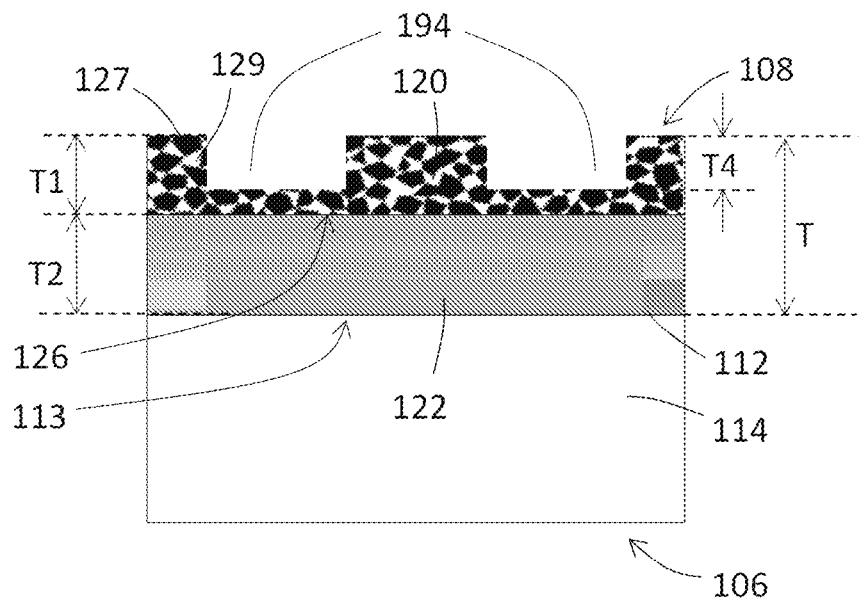
FIG. 2C illustrates a second step in the example process, showing the example cutter insert of FIG. 2A, including a PCD surface region including a network of pores between diamond grains, from which metal filler material has been removed.

With reference to FIG. 2C, the PCD material 112 may be treated with acid (not shown) to remove Co from the interstitial regions 129 among the diamond grains 127 within a first PCD portion 120, coterminous with the PCD surface 118 (in a process referred to as acid leaching). The first PCD portion 120 may extend to a depth T1 of about 100 microns to about 500 microns from the PCD surface 118, and interstitial regions 129 of the first PCD portion 120 may contain no more than about 2 wt. % Co, rendering the first PCD portion 120 substantially electrically insulating. A second PCD portion 122, in which the interstitial regions 129 are still filled with Co-containing metal, may remain non-leached and extend a depth T2 from an interface boundary 126 with the first PCD portion 120 to the interface boundary 113 between the PCD material 112 and the substrate portion 114.

In other example methods, the PCD material 112 may be acid treated to leach out Co (or other material within the interstitial regions 129) before the trench 194 is cut or etched into the PCD surface 118. If the trench 194 is formed into the PCD material 112 before the acid treatment, then the shape of interface boundary 126 between the first PCD portion 120 and the second PCD portion 122 may correlate with the shape of the trench 194.

In some examples, no trench 194 may be formed into the PCD portion 110, and the electronic device 130 may be attached to a substantially planar area of the PCD surface 118.

Figure 2D:
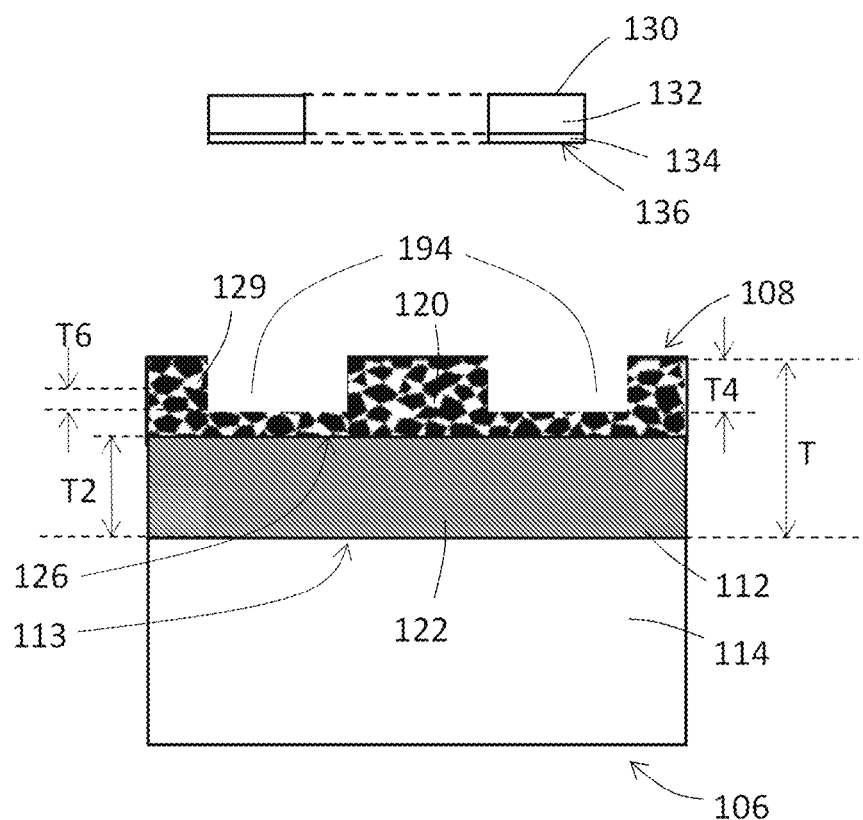
FIG. 2D illustrates a third step in the example process, the lower drawing showing a longitudinal cross-section view of the cutter element of FIG. 2B including metal alloy join material deposited within the trench, and the upper drawing showing a cross-section through arms of the example 'U'-shaped resistor to be placed into the trench, in contact with the metal alloy join material.
Figure 2E:
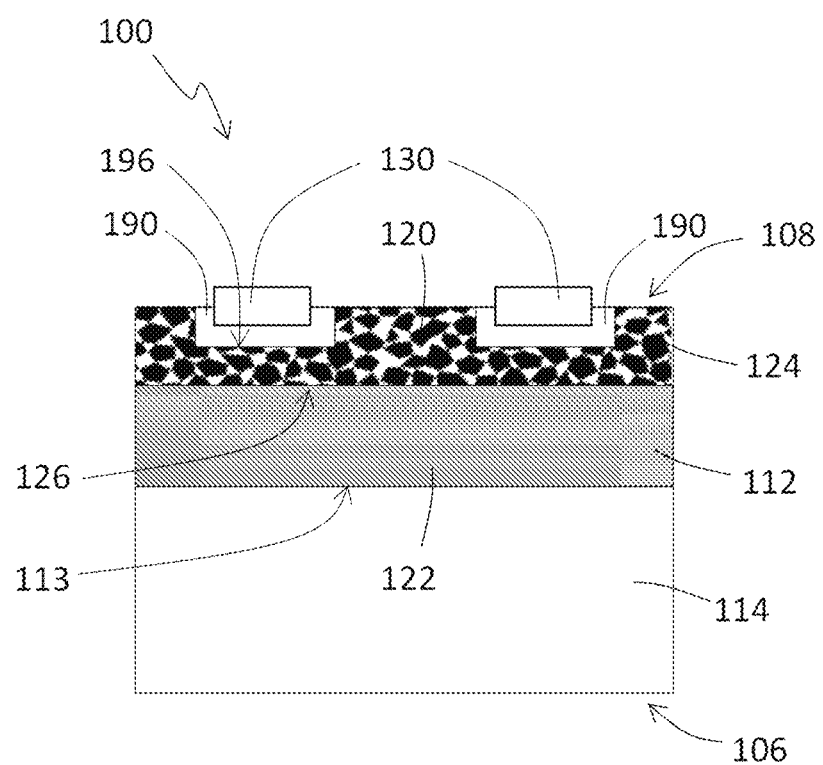
FIG. 2E illustrates a fourth step in the example process, showing the cutter element and the article of FIG. 2C, in which the 'U'-shaped resistor has been placed into the trench, in contact with the alloy material, to provide a pre-composite assembly.

With reference to FIG. 2D, a layer of paste 192 containing fine grains of metallic join material 192, or precursor material for metallic join material 192, may be deposited in the trench 194. In some examples, the chemical components of the metallic join material 192 may be provided segregated, as segregated pluralities of respective grain pluralities, each comprising different chemical ingredients for forming the metal join material 192. In other examples, grains comprising pre-formed alloy material 192 may be provided in paste form.

Suitable metal alloy materials 192 may have a liquidus of at most about 950° C. and may solidify at temperatures of up to about 600° C. If the liquidus of the metallic join material is too low, then it may melt when the composite product 100, such as a cutter insert 110, is braze-joined to a tool, such as a drill bit (not shown). For example, a drill bit for boring into the earth and cutting rock may include a plurality of cutter inserts 110 comprising PCD material 112 joined to a cemented carbide substrate portion 114 may be used, the substrate portion 114 of each cutter insert secured within a pocket provided on a drill bit body by braze-joining. Brazing the cutter insert 110 onto the drill bit body may involve heating at least a portion of the cutter insert 110 to a temperature of about 650° C. to about 700° C. In such examples, the melting point of the metallic join material 192 (at or below atmospheric pressure) may be greater than about 700° C., to reduce the risk of melting during the process of braze joining the cutter insert 110 to a tool. However, if the liquidus temperature of the alloy material 192 is substantially greater than 950° C., even in an inert or low-pressure atmosphere, then the diamond grains may begin to degrade by conversion into graphite (or other non-diamond form of carbon) when heated to a high enough temperature to melt the metallic join material 192. When heated above about 400° C. in an oxidising atmosphere such as air, the hardness and strength of PCD material 112 may start to reduce and increase substantially as the temperature is further increased.

For example, the metallic join material 192 may comprise or consist essentially of metal alloy material 192, which may include the chemical elements silver (Ag), copper (Cu), Indium (In) and titanium (Ti), such as the commercially available Incusil™ alloy having the composition 59.0% Ag, 27.25% Cu, 12.50% In and 1.25% Ti. In some examples, the metallic join material 192 may comprise an alloy including Pt and/or Pd; in some examples, metallic join material 192 may include gold (Au), in elemental or alloy form. Non-limiting example alloys for use as metallic join materials 192 to join various materials to the PCD material 112 are shown in Table 1. For example, electronic devices 130 may include the following materials coterminous with the device surface 136: ceramics such as yttria-stabilized cubic zirconia, alumina, barium titanate, lanthanum titanate. silicon carbide, lithium niobite.

TABLE 1

| Family | Liquidus temperature, (° C.) | Cu, wt. % | Pd, wt. % | Ag, wt. % | Ti, wt. % | In, wt. % | Sn, wt. % | Mn, wt. % | Al, wt. % |
|---|---|---|---|---|---|---|---|---|---|
| Cu-Ag-In | 715 | 27.3 | | 59 | 1.25 | 12.5 | | | |
| Ag-Cu | 815 | 35.3 | | 63 | 1.75 | | | | |
| Ag-Cu | 900 | 26.7 | | 69 | 4.5 | | | | |
| Ag | 912 | 5 | | 93 | 1.2 | | | | 0.8 |
| Cu-Ag | 730 | 32.5 | | 57.5 | | | 7 | 3 | |
| Ag-Cu | 790 | 22 | | 75 | | | | 3 | |
| Ag-Cu | 705 | 24 | | 61.5 | | 14.5 | | | |
| Ag-Cu | 852 | 31 | 10 | 59 | | | | | |
| Ag | | | | 98.4 | 0.6 | 1 | | | |

The electronic device 130 may be placed onto the layer of metallic join material 192 to provide a pre-composite assembly (not shown), which may be heat treated at a temperature of about 740° C. in a vacuum of about 1 mPa ($10^{-5}$ mbar), for example. Binder material in the paste may be burnt off and the chemical components of the metallic material 192 will melt. Much of the metallic alloy material 192 may infiltrate into the interstitial voids 129 within the first PCD portion 120. Ti or other carbide-forming metal within the alloy material 192 may react with carbon from the diamond grains 128 to form TiC, chemically bonding the alloy material 192 to the diamond grains 128. The temperature is then reduced to ambient temperature, well below the melting point of the alloy material 192, allowing the alloy material 192 to solidify and form the connection portion 190, which may comprise infiltrated metallic alloy material 192 and a portion of the PCD material 112. The connection portion 190 may have an interface boundary 196 with a non-infiltrated region 124 of the first PCD portion 120.

While wishing not to be bound by a particular theory, the hardness and strength of PCD material may be significantly reduced by heat by two principal mechanisms. In a first mechanism, the difference in thermal expansion coefficient of the diamond grains and metal filler material within the interstices among them may induce significant local thermal stress; and in a second mechanism, the diamond grains may begin to convert to graphite. Significant thermal stress may begin to increase with temperature from about 400° C. The temperature from which graphitisation of diamond begins to become significant depends on the local environment of a diamond surface; for example, the presence of air, or the presence of solvent/catalyst metal between diamond grains or included within diamond grains tends to promote the conversion of diamond into graphite (when the applied pressure is less than about 1.9 GPa). For example, the presence of Co at a diamond surface, in air, may begin to degrade the diamond grains from about 750° C. The working life of PCD cutting tools may be limited by the graphitisation of the diamond grains at high working temperatures, which could induce spalling and chipping of the PCD material.

In some applications, the temperature in a region of the PCD material adjacent the cutting edge may exceed about 1,000° C. Particularly but not exclusively in such applications, an electronic device may be positioned sufficiently spaced apart from a cutting edge, to reduce a risk of damage to the electronic device and the risk of the metallic join material melting and the electronic device detaching from the PCD material in use.

In general, the electronic device may be joined to the PCD material by melting the metallic join material in an atmosphere having a pressure of at least about $10^{-3}$ mbar (100 mPa) or at least about $10^{-5}$ mbar (10 Pa); for example, in the range of about $10^{-3}$ mbar (100 mPa) to about $10^{-5}$ mbar (10 Pa). Heat treating at such pressures may have the aspect of enhancing the chemical reaction of the metallic join material (alloy) with the diamond grains and enhancing its infiltration through the interstitial voids. In some examples, the heat treatment may be carried out in an inert atmosphere.

Figure 3A:
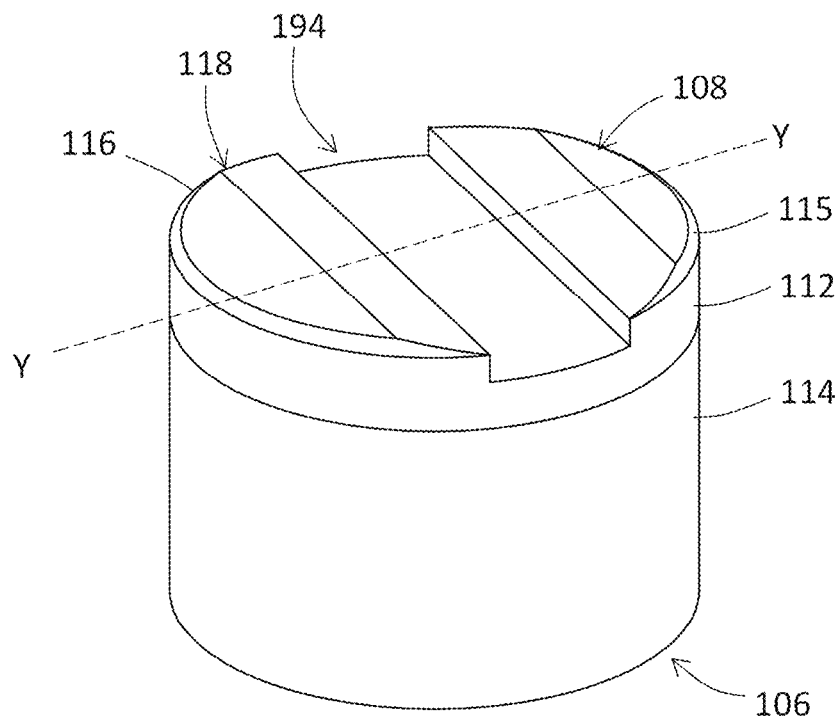
FIG. 3A shows a schematic perspective view of an example PCD cutter insert comprising a PCD layer joined to a cemented carbide substrate, in which the PCD layer includes a trench, arranged diametrically through the PCD layer, to accommodate an electronic device.

Other example composite products 100 will be described. With reference to FIG. 3A, a PCD body for an example cutter insert 110 has a proximal end 106 and a distal end 108 and comprises a PCD portion 112 joined to a Co—WC substrate 114 at an interface boundary 113. The layer of PCD material 112 has a PCD surface 118 at the distal end 108, which may coincide with a distal PCD end 108; and the interface boundary 113 with the substrate portion 114 may coincide with a proximal PCD end 113 of the PCD portion 112. The PCD surface 118 includes a peripheral cutting edge 116 and a chamfer 115 is formed on the PCD material 112, adjacent the cutting edge 116. In this example, the PCD portion 112 includes a trench 194 extending diametrically through the PCD material 112, for accommodating an electronic device 130 (illustrated in FIG. 3B). In some examples, the trench 194 may be formed into the PCD material 112 by means of a laser material removal device (not shown).

Figure 3B:
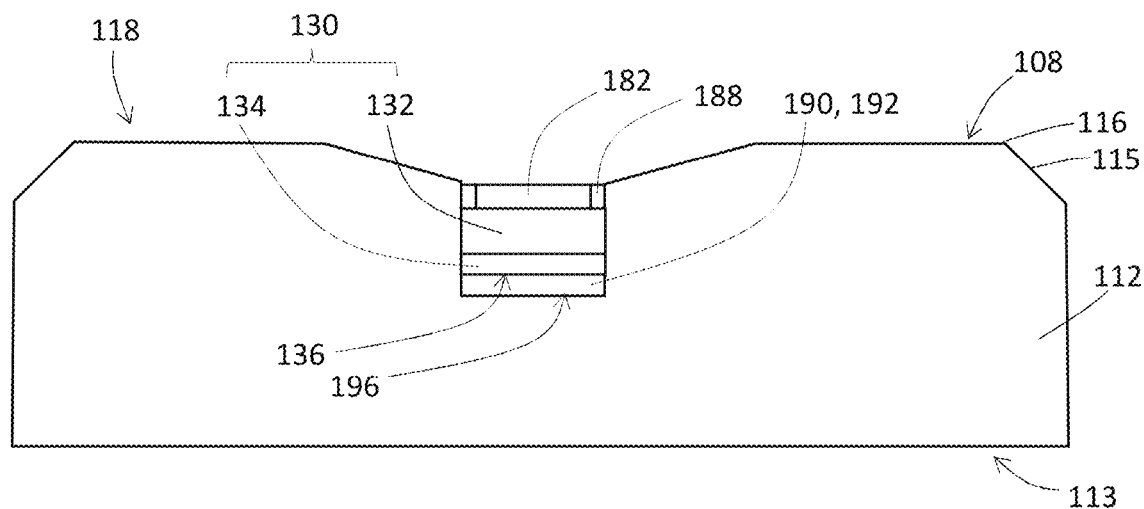
FIG. 3B shows a schematic longitudinal cross-section view (Y-Y indicated in FIG. 3A) through an example composite article, including an electronic device located in the trench of the PCD cutter insert as illustrated in FIG. 3A, and joined to the PVCD material.

FIG. 3B shows a schematic longitudinal cross-section view through the PCD portion 112, in a plane including the line Y-Y in FIG. 3A. An example electronic device 130 is attached to the PCD material 112, positioned within the trench 194. The electronic device 130 may comprise an electronic component 132 and an electrically insulating base plate 134, which may comprise or consist essentially of electrically insulating ceramic material. In various examples, the electronic component 132 may comprise a sensor device (or a part of a sensor device), a transceiver, an electronic circuit such as an integrated circuit (IC), a resistor, a capacitor, an inductor or a transistor, or a combination of two or more of these. A connection portion 190 comprising alloy material 192 may join the base plate 134 to the bottom of the trench 194.

In this example, a cover plate 182 is located over the electronic device 130, to protect it from abrasion or other degradation processes in use. The cover 182 may comprise or consist essentially of PCD material, diamond made by chemical vapour deposition (CVD), and/or other abrasion-resistant material such as alumina, aluminium nitride, zirconia, silicon nitride, polycrystalline cubic boron nitride, PCBN, material. In this example, the cover 182 may be oblong in shape, to match the shape of the trench 194, and may have a mean thickness of about 100 to about 150 microns. In examples where the electronic device 130 includes a transceiver antenna, the material selected for a cover 182 may have suitable dielectric properties to allow RF signals to pass with as little attenuation as possible. A side of the cover 182 may be joined to a side of the trench 192 by a join layer 188. The join layer 188 may comprise braze material or adhesive material, such as epoxy, or the cover 182 may be joined to the PCD material 112 by a diffusion bonding process, for example. As an example, a layer of metallic alloy material (or precursor material for forming a metallic alloy) may be deposited onto the side of the cover 182, and/or the side of the trench 194, by a sputtering or other PVD method, and pressure applied to the cover 182 to enhance inter-diffusion of the alloy material into the cover 182 and the side of the trench 194. In some example arrangements, the PCD surface 118 may include an angled area (not shown) adjacent the trench 194 and the cover 182 may include a mating angled area (not shown). The angled area of the PCD surface 118 may be angled at about 10° to about 80° with respect to a longitudinal axis (not shown) of the cutter insert 110, and the join material 188 may be deposited onto one or both the angled areas of the PCD material 112 or the cover 182.

An example method of forming a trench 194 into a PCD surface 118 of PCD material, for seating an electronic device 130, may include providing a mask (not shown) that includes a through-aperture having the shape of the electronic device 130, and placing the mask over the PCD surface 118. A laser machining or etching apparatus may be used to remove PCD material 112 from an area of the PCD surface 118 exposed by the mask, to form the trench 194. Residual graphitic carbon within the trench 194 may be removed by sand-blasting the trench 194. The trench 194 may be cleaned by sandblasting, to remove any residual non-diamond carbon. The metallic join material 192 may then be deposited into the trench 194 by a PVD process such as sputtering, or in the form of paste, and the electronic device 130 placed onto the metallic join material 192, seated within the trench 194. The metallic join material 192 may then be heated to at least its liquidus temperature, to melt it and allow it to bond to the PCD material 112 and to the electronic device 130, and then allowed to cool to form the connection portion 190.

Example composite products 100 in which the electronic device 130 is at least partly housed within a trench 194 may have the aspect of increasing the shear strength of the join between the electronic device 130 and the PCD material 112.

Figure 4:
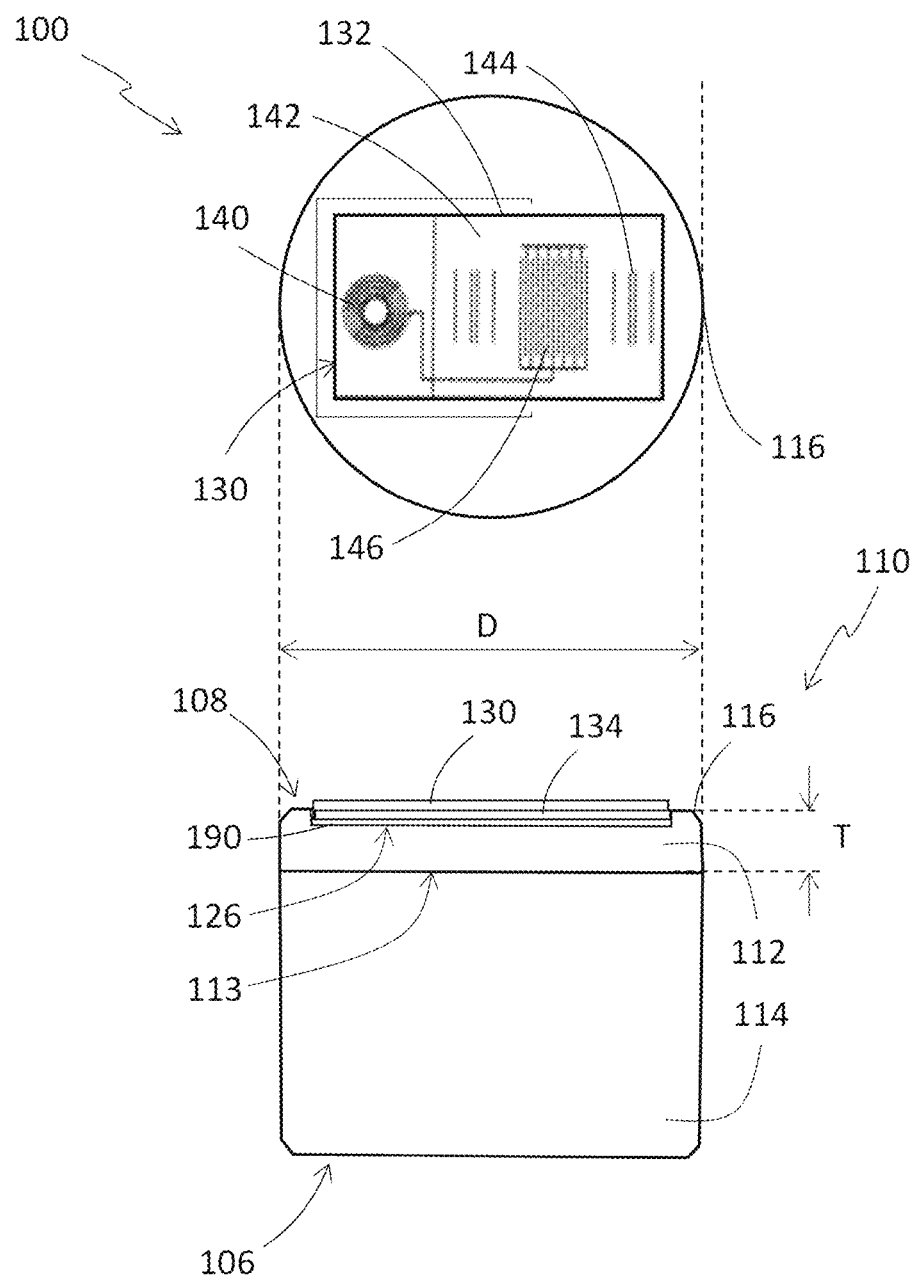
FIG. 4 shows a schematic top view (upper drawing) and side view (lower drawing) of an example composite product comprising a cutter insert for an earth-boring bit (prior to use), including an example surface acoustic wave (SAW) device.

In various examples, the electronic device 130 may comprise a radio-frequency (RF) tag 130 for use with an RF interrogation transceiver (not shown). With reference to FIG. 4, an example composite product 100 may comprise a surface acoustic wave (SAW) sensor device 130 attached to a cutter insert 110; and with reference to FIG. 5, an example composite product 100 may comprise an RF backscatter transceiver 130 attached to a cutter insert 110.

The cutter insert 110 may have a proximal end 106 and a distal end 108, and comprise a PCD portion 112 joined to a cemented carbide substrate 114 at an interface boundary 113. The PCD portion 112 has a PCD surface 118 that may be coincident with the distal end 108, and the interface boundary 113 may be coincident with a proximal PCD end 113. The cutter insert 110 may have a diameter D of about 16 mm and the PCD portion 112 may have a thickness T of about 2 to 3 mm. The PCD surface 118 has a peripheral cutting edge 116 and the PCD material may include a chamfer 115 adjacent the cutting edge 116. Both the SAW device 130 in FIG. 4 and the RF backscatter transceiver in FIG. 5 are attached to the PCD surface 118 by a connection portion 190.

With particular reference to FIG. 4, the SAW device 130 may comprise a plurality of electronic components 132 mounted onto a ceramic base 134, the electronic components 132 including an RF antenna 140, an interdigital transducer (IDT) 146, a piezoelectric strip 142 and a plurality of reflector strips 144. The connection portion 190 may comprise a layer of metallic alloy having a mean thickness of about 500 microns and join the ceramic base 142 to the PCD material 112 at an interface boundary 126. In some example arrangements, the connection portion 190 may directly join the piezoelectric strip 142 to the PCD surface 118; that is, the SAW device 130 may not include the base 134. The SAW device 130 may be seated within a trench in the PCD material 112, which may have the aspect of improving the shear strength of the attachment of the SAW device to the PCD material 112. In some examples, a thin cover layer (not shown) of abrasive-resistant material may be provided as a protective cover for the SAW device 130. An example cover layer may comprise diamond material, which may be produced by using a chemical vapour deposition (CVD) process and have a mean thickness of about 100 microns.

Figure 5:
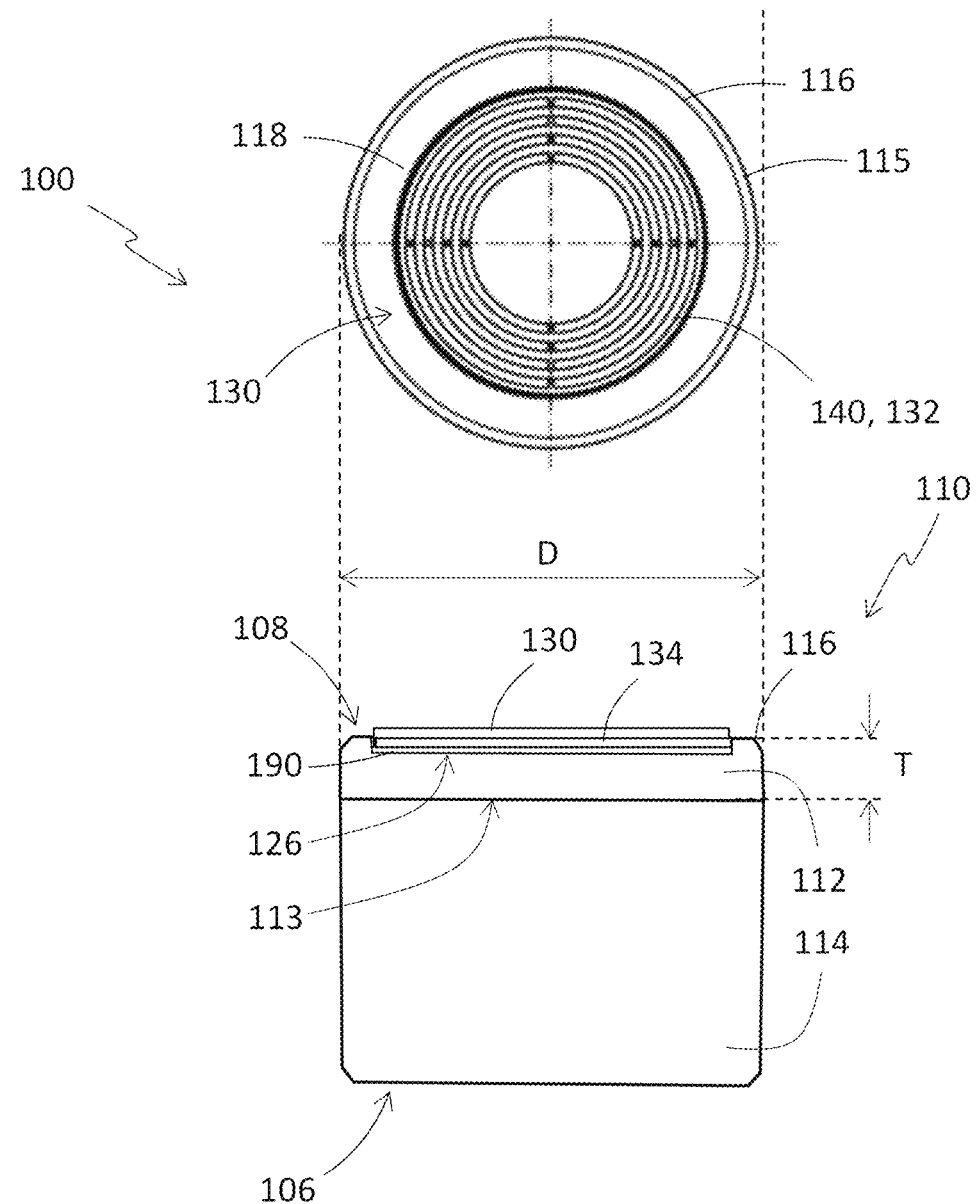
FIG. 5 shows a schematic top view (upper drawing) and side view (lower drawing) of an example composite product, including an RF backscatter antenna formed of an electrically conducting track.

With particular reference to FIG. 5, the RF backscatter transceiver 130 may comprise an electronic component 132 in the form of an RF antenna 140. The RF antenna 140 may be configured to resonate with, and to backscatter, an RF interrogation signal having a frequency in the range of about 200 kHz to about 10 GHz. As used herein, "RF" may refer to a frequency within this band of the electromagnetic spectrum; and in some examples, the RF interrogation signal frequency may lie within the industrial, scientific and medical (ISM) radio band. The RF antenna 140 may comprise a plurality of resonator tracks consisting essentially of gold (Au) and located within a layer (not shown) of barium strontium titanate (BST). The BST layer may be attached to an electrically insulating base plate 134, consisting essentially of alumina and having a thickness of about 0.5 mm. The connection portion 190 joins the base plate 134 to the bottom of a circular trench provided into the PCD material 112.

Example disclosed composite products may have the aspect of being mechanically and chemically robust, including when used down the hole in rock drilling applications. For example, a sensor device joined to a PCD cutter insert may be protected from high mechanical stresses and high temperatures. In some examples, the join between a sensor and a PCD body may exhibit good temperature tolerance and shear strength, which may not be achievable using known adhesive materials.

The invention claimed is:

1. A composite product comprising:
   a body of polycrystalline diamond (PCD) material having a PCD proximal end and a PCD distal end;
   an electronic device including an electronic component, and
   a connection portion joining the electronic device to the body at the PCD distal end, and comprising metallic join material having a liquidus temperature of 600° C. to 950° C. at atmospheric pressure;
   at least one of the electronic device and the body including an electrically insulating portion between the electronic component and the PCD proximal boundary establishing an electrical open circuit condition between the electronic component and the PCD proximal boundary.

2. The composite product as claimed in claim 1, wherein the electrically insulating portion comprises no more than 2 weight percent of electrically conducting material.

3. The composite product as claimed in claim 2, wherein the electrically insulating portion is free of electrically conducting material.

4. The composite product as claimed in claim 1, wherein the connection portion comprises a portion of the body of PCD material that includes metallic join material within interstitial regions among the diamond grains.

5. The composite product as claimed in claim 1, wherein the electronic device comprises a sensor for determining a condition of the composite product; and
   the body comprises a cutter element having a cutting edge for an earth-boring drill bit.

6. A method of making a composite product; the method including:
   providing a body of polycrystalline diamond (PCD) material having a PCD proximal end and a PCD distal end, the body including an electrically insulating portion;
   providing an electronic device including an electronic component and having a device surface;
   providing metallic join material having a liquidus temperature of 600° C. to 950° C. at atmospheric pressure, and capable of chemically bonding to the body of PCD material and the device surface;
   arranging the metallic join material between the device surface and the distal PCD end, the metallic join material being electrically insulated from the PCD proximal end by the electrically insulating portion;
   heating the metallic join material to a temperature of at least the liquidus temperature and no greater than 950° C., to allow the metallic join material to melt and connect the PCD body and the device surface; and
   allowing the metallic join material to cool and solidify to form the connection portion, the electrically insulating portion electrically insulating the connection portion from the PCD proximal end.

7. The method as claimed in claim 6, wherein the electrically insulating PCD portion is coterminous with the distal PCD end and includes no more than 2 weight percent of electrically conducting material.

8. The method as claimed in claim 7, wherein the electrically insulating PCD portion is free of electrically conducting material.

9. The method as claimed in claim 6, the PCD material comprising:
   a first PCD portion coterminous with the distal PCD end; and
   a second PCD portion, the first portion extending from the distal PCD end to an interface boundary with the second PCD portion;
   the first PCD portion comprising a network of interstitial voids among the diamond grains and being electrically insulating; the method including allowing molten metallic join material to infiltrate into the first PCD portion by moving through the interstitial voids to form the connection portion; wherein
   the interface boundary is sufficiently remote from the distal PCD end that the connection portion is spaced apart from the second PCD portion by an electrically insulating region of the first PCD portion.

10. The method as claimed in claim 6, wherein the metallic join material includes one or both of Ag and Cu, and at least one chemical element that reacts with carbon to form a carbide compound to chemically bond the metallic join material to the diamond grains.

11. The method as claimed in claim 6, wherein the metallic join material comprises a plurality of precursor materials; and providing the metallic join material includes combining the plurality of precursor materials.

12. The method as claimed in claim 11, including using physical vapour deposition (PVD), or chemical vapour deposition (CVD) to deposit the precursor materials onto at least one of the PCD surface and the device surface; or providing paste including grains of the precursor material or grains of the metallic join material and depositing the paste onto at least one of the PCD surface and the device surface.

13. The method as claimed in claim 6, including
   removing PCD material from the distal PCD end of the PCD body to form a recess into the PCD material; the recess configured to accommodate at least a portion of the electronic device;
   depositing a layer of metallic join material into the recess; and
   placing the electronic device into the recess, the device surface in contact with the layer of metallic join material.

14. The method as claimed in claim 6, including reducing the environmental gas pressure of the pre-composite assembly to at most 1 mPa ($10^{-5}$ mbar).

15. A method of making a composite product as claimed in claim 1; the method including:
   providing the body of PCD material;
   providing the electronic device including an electronic component, a device surface and an electrically insulating portion, the electrically insulating portion disposed between the electronic component and the device surface insulating the electronic component from the device surface;
   providing metallic join material having a liquidus temperature of 600° C. to 950° C. at atmospheric pressure, and capable of chemically bonding to the body of PCD material and the device surface;
   arranging the metallic join material between the electronic device surface and the PCD distal end, the metallic join material being electrically insulated from the electronic component by the electrically insulating portion;
   heating the metallic join material to a temperature of at least the liquidus temperature and no greater than 950° C. to allow the metallic join material to melt and connect the PCD body and the device surface; and
   allowing the metallic join material to cool and solidify to form the connection portion, the electrically insulating portion electrically insulating the electronic component from the connection portion.

16. The method as claimed in claim 15, wherein the metallic join material includes one or both of Ag and Cu, and at least one chemical element that reacts with carbon to form a carbide compound to chemically bond the metallic join material to the diamond grains.

17. The method as claimed in claim 15, wherein the metallic join material comprises a plurality of precursor materials; and providing the metallic join material includes combining the plurality of precursor materials.

18. The method as claimed in claim 17, including using physical vapour deposition (PVD), or chemical vapour deposition (CVD) to deposit the precursor materials onto at least one of the PCD surface and the device surface; or providing paste including grains of the precursor material or grains of the metallic join material and depositing the paste onto at least one of the PCD surface and the device surface.

19. The method as claimed in claim 15, including
removing PCD material from the distal PCD end of the PCD body to form a recess into the PCD material; the recess configured to accommodate at least a portion of the electronic device;
depositing a layer of metallic join material into the recess; and
placing the electronic device into the recess, the device surface in contact with the layer of metallic join material.

20. The method as claimed in claim 15, including reducing the environmental gas pressure of the pre-composite assembly to at most 1 mPa ($10^{-5}$ mbar).

* * * * *